United States Patent
Kato

(10) Patent No.: US 6,674,678 B2
(45) Date of Patent: Jan. 6, 2004

(54) SENSE AMPLIFIER CONTROL CIRCUIT OF SEMICONDUCTOR MEMORY DEVICE

(75) Inventor: Daisuke Kato, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/267,949

(22) Filed: Oct. 9, 2002

(65) Prior Publication Data

US 2003/0031071 A1 Feb. 13, 2003

Related U.S. Application Data

(63) Continuation of application No. 10/035,043, filed on Dec. 27, 2001, now Pat. No. 6,496,435.

(30) Foreign Application Priority Data

Jan. 5, 2001 (JP) .......................... 2001-000475

(51) Int. Cl.⁷ .............. G11C 7/02; G11C 7/00
(52) U.S. Cl. ................... 365/207; 365/196
(58) Field of Search ................. 365/207, 196, 365/208, 205, 189.08

(56) References Cited

U.S. PATENT DOCUMENTS

| | | |
|---|---|---|
| 4,855,628 A | 8/1989 | Jun |
| 4,948,993 A | 8/1990 | Chin et al. |
| 5,030,859 A | 7/1991 | Ihara |
| 5,130,580 A | 7/1992 | Min et al. |
| 5,636,158 A | 6/1997 | Kato et al. |
| 5,646,900 A * | 7/1997 | Tsukude et al. ............ 365/205 |
| 6,272,061 B1 | 8/2001 | Kato et al. |

OTHER PUBLICATIONS

Yohji Watanabe, et al., "A 286 mm² 256Mb DRAM with × 32 Bith–Ends DQ", IEEE Journal of Solid–State Circuits, vol. 31, No. 4, Apr. 1996, pp. 567–574.

* cited by examiner

*Primary Examiner*—Thong Quoc Le
(74) *Attorney, Agent, or Firm*—Hogan & Hartson, LLP

(57) ABSTRACT

A sense amplifier section of a semiconductor memory device includes a memory cell array and a plurality of bit line pairs arranged in a column direction of the memory cell array. The sense amplifier section is configured to control the transfer of data to or from the memory cell array via the bit line pairs. The sense amplifier section includes an array of layout units respectively including circuit portions of sense amplifiers, wherein the layout units are disposed in the array of layout units at intervals smaller than intervals of the bit line pairs.

14 Claims, 7 Drawing Sheets

SENSE AMPLIFIER CONTROL CIRCUIT OF SEMICONDUCTOR MEMORY DEVICE

CROSS-REFERENCE TO RELATED APPLICATIONS

This application is a continuation of application Ser. No. 10/035,043, now U.S. Pat. No. 6,496,435 filed Dec. 27, 2001.

This application is based upon and claims the benefit of priority from the prior Japanese Patent Application No. 2001-000475, filed Jan. 5, 2001, the entire contents of which are incorporated herein by reference.

BACKGROUND

1. Field of the Invention

Some conventional semiconductor memory devices use a sense amplifier consisting of a latch type differential amplifier circuit. The circuit arrangement of a conventional differential amplifier will be described below in terms of a sense amplifier section for amplifying the bit-line potential in a dynamic random access memory (DRAM) as an example.

2. Description of the Related Art

The sense amplifier section shown in FIG. 1 includes a bit line pair /BL<2> and BL<2> (<2> is illustrated by example), an equalizer and multiplexer (EQL&MUX) 101, an N-channel sense amplifier (NSA) 102, an NSA common source line 103, an NSA set driver 104, and a DQ gate 105. The equalizer comprises N-channel transistors (hereinafter referred to as NFETs) Q11, Q12, and Q13. The multiplexer comprises NFETs Q14 and Q15. The NSA 102 comprises NFETs Q16 and Q17. The NSA common source line 103 provides a "0" write potential VBLL (e.g., Vss) to the common sources of the NFETs Q16 and Q17 in the NSA 102. The NSA set driver 104 provides VBLL to the NSA common source line 103. The DQ gate 105 comprises NFETs Q18 and Q19.

To the right of the DQ gate 105 are further provided a P-channel sense amplifier (PSA) 106, a PSA common source line 107, and a PSA set driver 108. The PSA 106 comprises P-channel transistors (hereinafter referred to as PFETs) Q20 and Q21. The PSA common source line 107 transfers a "1" write potential (e.g., VBLH) to the common sources of the transistors Q20 and Q21 in the PSA 106, and the PSA set driver 108 provides VBLH to the PSA common source line 107. Furthermore, the PSA 106 is followed by a multiplexer comprised of NFETs Q22 and Q23 and an equalizer comprised of NFETs Q24, Q25 and Q26.

Such a sense amplifier as described above is provided for each bit line pair; thus, as shown in the lower portion of FIG. 1, the same circuit is also provided for /BL<0> and BL<0> (<0> is merely exemplary). The VBLH/2 power supply lines on the right and left supply the equalized potential VBLH/2 to the bit line pairs. CSL denotes a column select signal line. Though not shown, memory cells, each consisting of a cell capacitor and a cell transistor, are connected on the opposite sides of the sense amplifier section to each bit line pair.

The major part of the sense amplifier of FIG. 1 is formed from the NSA 102 and PSA 106 each of which has its transistors cross-coupled to the bit line pair. The common source line 103 of the NSA 102 is connected by the NSA set driver 104 consisting of an NFET to a bit line restore power supply line at the "0" write potential VBLL (e.g., Vss). The common source line 107 of the PSA 106 is connected by the PSA set driver 108 consisting of a PFET to a bit line restore power supply line at the "1" write potential VBLH.

With the conventional sense amplifier, as described above, the NSA set driver is formed of an NFET and the PSA set driver is formed of a PFET. At sense time, latch signals NSET and bPSET are set high and low, respectively, thereby amplifying a small potential difference between the bit lines to set the bit line BL (or the /BL) at "1" write potential on the high potential side and the bit line /BL (or the BL) at "0" write potential on the low potential side, respectively.

SUMMARY

According to an aspect of the present invention there is provided a sense amplifier section of a semiconductor memory device that includes a memory cell array and a plurality of bit line pairs arranged in a column direction of the memory cell array. The sense amplifier section is configured to control the transfer of data to or from the memory cell array via the bit line pairs. The sense amplifier section includes an array of layout units respectively including circuit portions of sense amplifiers formed in a well region. None of the layout units include any contacts for biasing the well region. The sense amplifier also includes a contact disposed outside of the layout units and configured to bias the well region.

According to another aspect of the present invention there is provided a sense amplifier section of a semiconductor memory device that includes a memory cell array and a plurality of bit line pairs arranged in a column direction of the memory cell array. The sense amplifier section is configured to control the transfer of data to or from the memory cell array via the bit line pairs. The sense amplifier section includes an array of layout units respectively including circuit portions of sense amplifiers, wherein the layout units are disposed in the array of layout units at intervals smaller than intervals of the bit line pairs.

According to a further aspect of the present invention there is provided a sense amplifier section of a semiconductor memory device that includes a memory cell array and a plurality of bit line pairs arranged in a column direction of the memory cell array. The sense amplifier section is configured to control the transfer of data to or from the memory cell array via the bit line pairs. The sense amplifier section includes an array of sense amplifiers disposed at intervals smaller than intervals of the bit line pairs. The sense amplifier section also includes a varying region, in which the intervals of the sense amplifiers are obtained by changing the intervals of the bit line pairs formed in a portion in contact with a boundary between the sense amplifier section and the memory cell array.

DETAILED DESCRIPTION OF THE INVENTION

The following are detailed descriptions of embodiments of the present invention with reference to accompanying drawings; however in order to clarify the comparison between the embodiments of the present invention and the conventional technique, the arrangement will be described in the conventional technique how to place the set drivers in the sense amplifier section.

Figure 2:
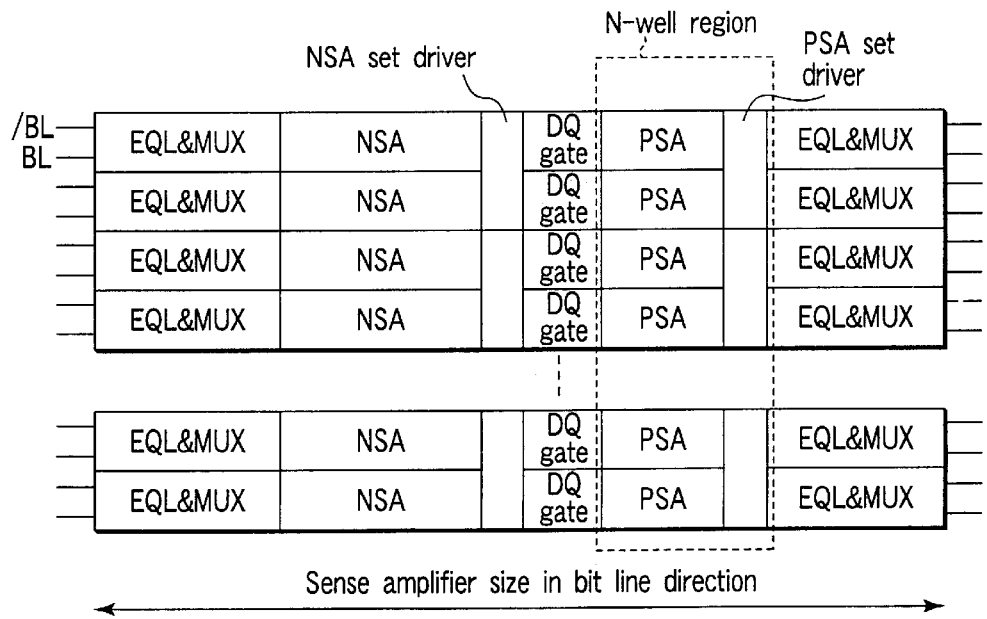
FIG. 2 is a block diagram of a conventional sense amplifier section.

As shown in FIG. 2, in the conventional arrangement, one set driver is provided for a relatively small number (for example one to four) of sense amplifiers and the set drivers are placed adjacent to the NSA and PSA at regular intervals in the direction in which the sense amplifier layout is repeated.

The set drivers thus placed are called the distributed set drivers. In the exemplary distributed arrangement of FIG. 2, one NSA set driver is placed every two NSAs and one PSA set driver is placed every two PSAs.

There is another method by which one set driver is shared among the common source lines of a relatively large number of sense amplifiers and such set drivers are placed together in an area other than the area where the sense amplifiers are laid out repeatedly. The set drivers thus placed are called the concentrated set drivers. The set drivers may be placed either in the distributed or concentrated form.

With the distributed form, however, places for set drivers must be provided adjacent to the NSAs and PSAs as shown in FIG. 2. Since the size of a set driver relative to a sense amplifier is not large, the placement of one set driver for a smaller number of sense amplifiers will reduce the layout efficiency, resulting in an increase in the size of the sense amplifier section in the bit line direction.

The entire cell array of a DRAM is constructed from many cell array blocks divided by sense amplifier regions. Therefore, a slight increase in the size of each sense amplifier has a great effect on the chip size. For this reason, the concentrated set drivers are generally used in conventional DRAMs.

Figure 3:
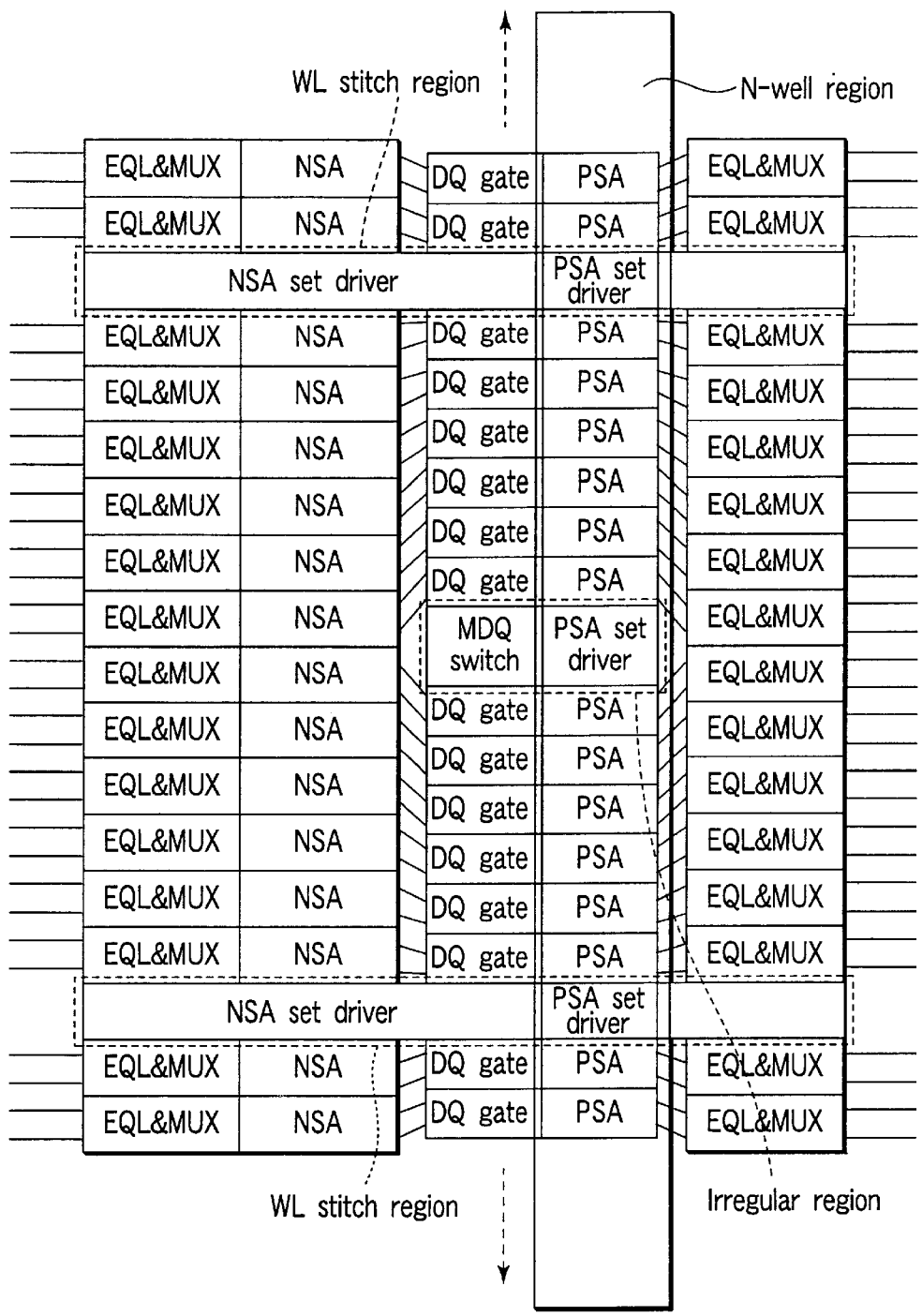
FIG. 3 is a diagram for use in explanation of a conventional way to place set drivers in a word line stitch region and an irregular region.

The concentrated set drivers are frequently placed in WL stitch regions each of which is provided every two or more rows (two or more bit line pairs) in the direction in which word lines (WL) extends (the vertical direction of FIG. 2). The WL stitch regions are ones where metal word lines of low resistance and gate interconnect lines of relatively high resistance are stitched. Also, the set drivers can be placed in irregular regions resulting from making the repetition period (pitch) of sense amplifiers a little smaller than that of bit line pairs /BL and BL (see U.S. Pat. No. 5,636,158). An example of such placement is illustrated in FIG. 3. In this example, the NSA set drivers are placed in WL stitch regions, whereas the PSA set drivers are placed in the WL stitch regions and the irregular regions including MDQ switches.

Figure 1:
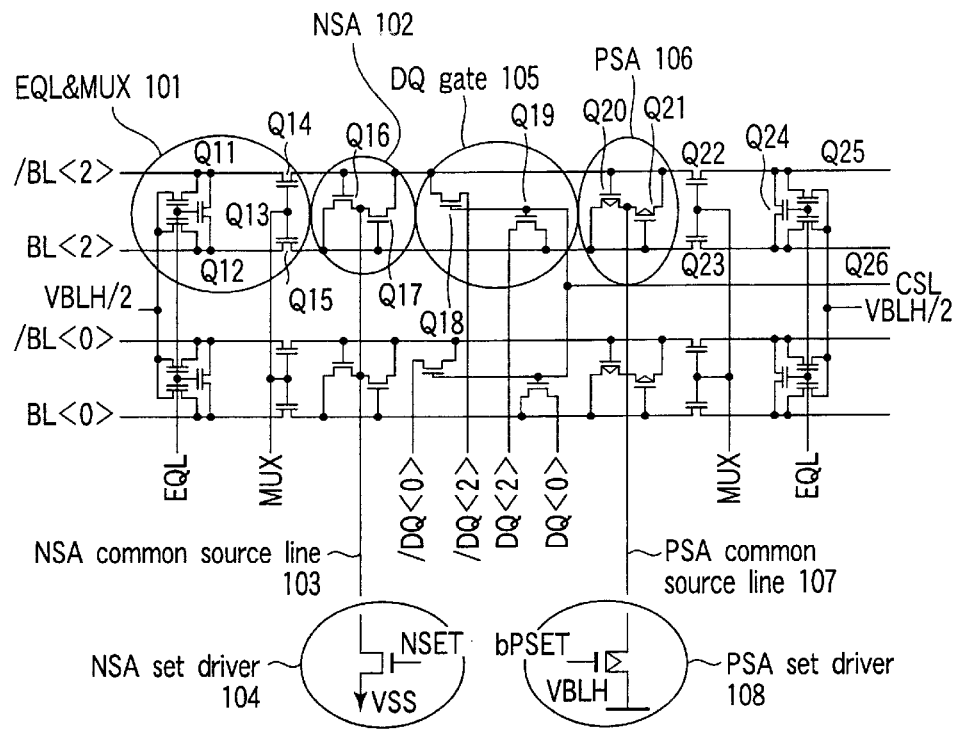
FIG. 1 shows the circuit arrangement of a sense amplifier section of a conventional semiconductor memory device.

In the sense amplifier section of FIG. 1, the NFETs are used in far greater numbers than the PFETs. Thus, the PFETs for the PSAs and PSA set drivers are formed in an N-well region of relatively small width which extends in the direction in which the sense amplifiers are repeated as shown in FIG. 3.

The reason why the NSA set drivers are placed only in the WL stitch regions-is that the P-well regions in the WL stitch regions are large enough to accommodate the NSA set drivers of required size.

The reason why the PSA set drivers are placed in both the stitch regions and the irregular regions is that the width of the N-well region which is determined to conform to the layout of PSAs by itself is not so large as to allow the stitch regions to accommodate PSA set drivers of sufficient size.

As described previously, the entire cell array of DRAMs and the like is formed from many cell array blocks separated by sense amplifier sections. In order to realize low-cost, small chips, therefore, it is very important to reduce the sense amplifier size in the bit line direction. For this reason, efforts have been made to form as small a sense amplifier as possible.

In the sense amplifier section shown in FIG. 1, the NFETs are far greater in number than the PFETs. As a result, the P-well region is far larger than the N-well region in view of the entire layout of sense amplifiers. With transistors constituting sense amplifiers, therefore, the PFETs have little freedom in layout comparing with the NFETs.

For example, even if the size of the PSA itself is shrunk owing to an improvement in the layout, it is impossible to reduce the N-well region width unless the size of the PSA set driver is shrunk at the same time. In the narrow N well, regions where PSA set drivers are to be placed are restricted to the WL stitch regions or irregular regions. In general, when the ratio of layout size to design rules is reduced, the freedom in layout in the region is lowered; thus, it is not easy to shrink the layout size in the bit line direction of the PSA set driver which is formed of a PFET only in a narrow region.

It might be supposed to, while decreasing the width of the N well, increase the size of the irregular region in the N well in the direction in which sense amplifiers are repeated by increasing the difference in repetition period between PSAs and bit line pairs and place the PSA set driver in that irregular region. However, the increased difference in repetition period makes the connection between bit lines and sense amplifiers difficult.

As described above, in the conventional sense amplifier section consisting of the latch type differential amplifier, the NSA set driver connected to one common source line is formed by an NFET and the PSA set driver connected to the other common source line is formed by a PFET, which, in itself, imposes restrictions on the freedom in layout. As a result, it becomes difficult to shrink the size of sense amplifiers.

As described above, the conventional sense amplifier control circuit for use in a semiconductor memory device is configured such that the set driver for NSA is formed by an NFET and set driver for PSA is formed by a PFET; thus, difficulties are involved in shrinking the size of the entire sense amplifier section including control circuits. In view of the prior art described above, including its disadvantages and deficiencies, the following embodiments of the present invention will be described in detail to provide the arrangement of a transistor circuit for sense amplifier set drivers which allows the size of the entire sense amplifier section to be shrunk.

[First Embodiment]

Figure 4:
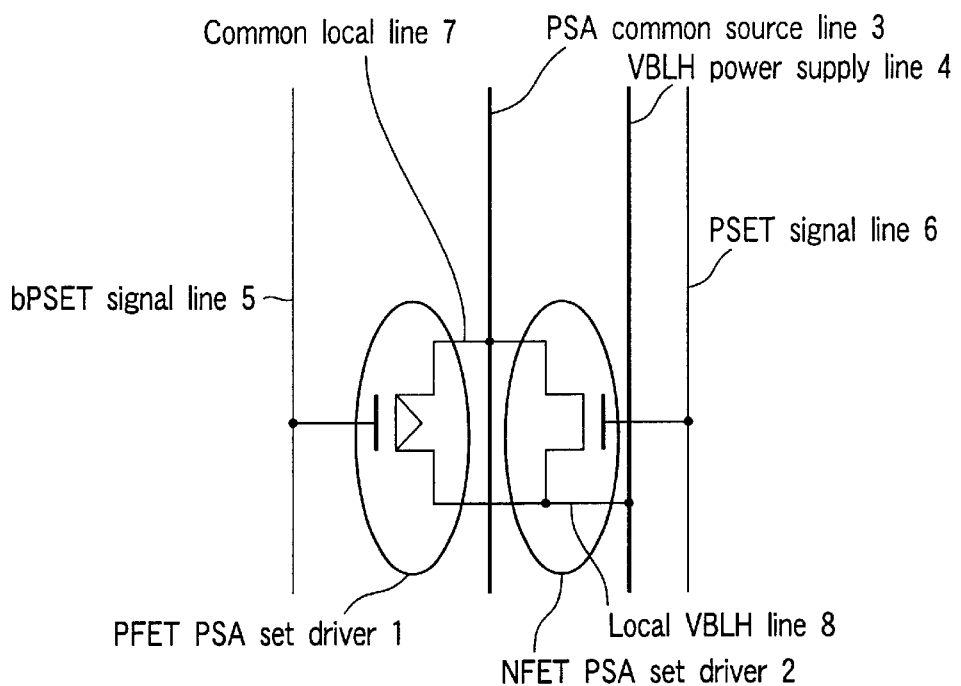
FIG. 4 shows the circuit arrangement of a PSA set driver according to a first embodiment of the present invention.

FIG. 4 shows the arrangement of a transistor circuit for a PSA set driver connected to a PSA common source line of a sense amplifier consisting of latch type differential amplifier circuit.

The PSA set driver shown in FIG. 4 is composed of a PFET PSA set driver 1, an NFET PSA set driver 2, a PSA common source line 3, a VBLH power supply line 4, a bPSET signal line 5 for activating the PFET PSA set driver, a PSET signal line 6 for activating the NFET PSA set driver, a local common source line 7, and a local VBLH line 8. By setting the input signal bPSET to the gate of the set driver 1 and the input signal PSET to the gate of the set driver 2 low and high, respectively, the PSA common line 3 is set at the bit line restore potential VBLH.

In the first embodiment, as shown in FIG. 4, the PSA set drivers connected to the PSA common source line 3 are formed by a PFET and an NFET. As described previously, in view of the entire layout of the sense amplifier section, the P-well region is very large in comparison with the N-well region and hence high in the freedom in layout and placement of the NFET. Therefore, any increase in the layout area accompanied by introducing the NFET PSA set driver 2 can be avoided.

The formation of the PSA set driver by a PFET and an NFET allows the driving capability conventionally borne by only the PFET PSA set driver to be allocated to the NFET PSA set driver. Therefore, the size of the PFET PSA set driver can be shrunk. In addition, the ratio of allocation can be set arbitrarily; thus, the PSA set driver can be formed by only the NFET PSA set diver 2.

When the layout size of the PSA itself is shrunk owing to an improvement in layout, the layout size of the PFET PSA set driver can also be shrunk simultaneously, allowing the width of the N well to be substantially determined by the layout of the PSA itself.

The use of the PSA set driver circuit arrangement according to the first embodiment, which can be formed by an NFET only or both a PFET and an NFET unlike the conventional sense amplifier control circuit, allows the width of the N well where the PFETs of PSAs are to be placed to be minimized. In the conventional control circuit, the PSA set driver is formed by a PFET only. The size of the sense amplifier can therefore be shrunk, allowing a semiconductor memory device which is small in chip size and highly competitive in cost to be realized.

Although the first embodiment has been described in terms of the circuit arrangement of the PSA set driver, this is not restrictive. When the N well region is very large in comparison with the P well region in the entire layout of the sense amplifier section, if the NSA set driver is formed from an NFET and a PFET, any increase in the layout area accompanied by introducing the PFET NSA set driver can be avoided.

Thus, if the driving capability borne by the NFET NSA set driver is allocated to the PFET NSA set driver, the size of the NFET NSA set driver can be shrunk. In addition, it is also possible to form the NSA set driver from a PFET only.

As described above, the use of not only an NFET but also a PFET for the NSA set driver provides greater freedom in layout and makes for a reduction in chip size.

[Second Embodiment]

Figure 5:
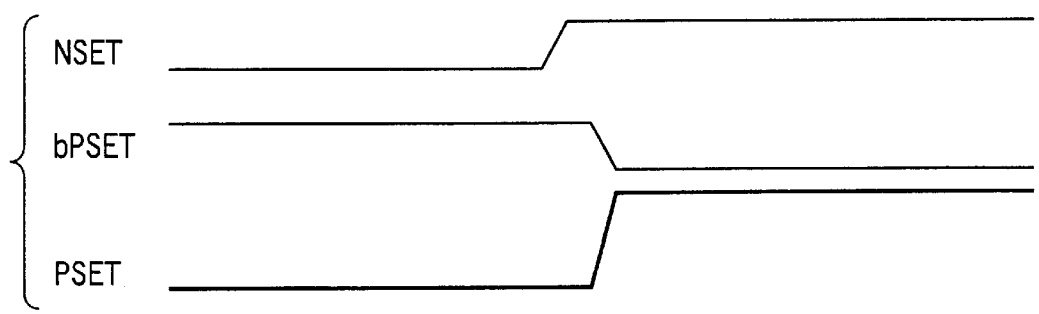
FIG. 5 is a timing diagram of set signals for the PSA set driver according to a second embodiment of the present invention.

FIG. 5 is a timing diagram for sense amplifier activation signals according to a second embodiment of the present invention.

The second embodiment is directed to the activation-time potentials of activation signals (set signals) for set drivers which are formed from transistors of opposite conductivity type to transistors in corresponding sense amplifiers. Specifically, the activation signals for set drivers in which the transistors of opposite conductivity type are of N type are set higher than the high supply voltage inside the semiconductor memory device (VINT or VBLH>0). The activation signals for set drivers in which the transistors of opposite conductivity type are of P type are set lower than the low internal supply voltage (Vss, GND, 0V, or VBLL).

For example, as shown in FIG. 5, the activation-potential (high level) of the set signal PSET for the NFET PSA set driver (as indicated at 2 in FIG. 4) for PFET PSA is set higher than the internal supply voltage for peripheral circuit, VINT. In FIG. 5, NSET, which is the set signal for the NFET NSA set driver for NSA, is set, at activation time, to VINT. The set signal for the PFET PSA set driver for PSA (as indicated at 1 in FIG. 4), bPSET, is set, at activation time, to the low level Vss, GND, or 0V.

The reason why the set signal PSET for the NFET PSA set driver is set higher than VINT is as follows:

In order to activate the NFET PSA set driver and thereby cause the PSA common source line to go to the bit line restore potential VBLH, the potential of the set signal PSET at activation time is required to be higher than VBLH by not less than the threshold voltage of the NFET PSA set driver. The higher the potential of the set signal PSET at activation time, the higher the set driver driving capability becomes; thus, the set driver small in size can achieve the required driving capability.

The reason why the set signal for PFET NSA set driver is set lower than VSS, GND, 0V or VBLL when the transistors of opposite conductivity type are of P type can be explained in a similar way to the N type case by considering the electrical properties of transistors of opposite conductivity type.

Thus, the layout of the set driver can be made small and the size of the sense amplifier can be reduced by increasing the driving capability of the set driver. As a result, a semiconductor memory device can be realized which is small in chip size and highly competitive in cost.

In comparison with a set driver of the same size, the restoring capability of the sense amplifier is increased because of the high driving capability of the set driver, allowing a fast semiconductor memory device to be realized. The effect of increasing the driving capability of NFET (or PFET) PSA (or NSA) set driver can be further enhanced by setting the potential of the set signal for activating set driver to an internal boost voltage higher than the external high supply voltage VEXT (VDD) (or lower than the external low supply voltage Vss).

[Third Embodiment]

The third embodiment is directed to setting of the threshold voltage of transistors in set drivers which are of opposite conductivity type to transistors in the corresponding sense amplifiers. When these transistors are of N type, their threshold voltage is set lower than that of other N-type transistors in the semiconductor memory device; otherwise, the threshold voltage is set higher than that of other P-type transistors. In other words, the absolute value of the threshold voltage of the transistors of opposite conductivity type is set smaller that that of other transistors of opposite conductivity type in a semiconductor memory device.

For example, the threshold voltage of NFETs constituting NFET PSA set drivers for P-channel sense amplifiers (PSAs) is set lower that that of other NFETs used in the semiconductor memory device.

Specifically, the threshold voltage of other NFETs is usually of the order of 0.5 to 0.6 V. The threshold voltage of NFETs constituting NFET PSA set drivers is set to 0.3 V or below (low threshold NFETs). In a system in which the difference between the potential of the bit line before operation (the potential close to the equalized potential) and the "0" write potential VBLL (e.g., Vss) is not sufficiently large, low-threshold NFETs are sometimes used as NFETs that constitute N-channel sense amplifiers (NSAs). In this case, the use of low-threshold NFETs in NFET PSA set drivers would require no additional process to introduce low-threshold NFETs into NFET PSA set drivers.

The reason why, when the transistors of opposite conductivity type are of P type, the threshold voltage of PFET NSA set drivers is set higher than that of other PFETs in the semiconductor memory device can be explained in a similar way to the N type case by considering the electrical properties of transistors of opposite conductivity type.

Thus, by setting the absolute value of the threshold voltage of transistors in set drivers which are of opposite conductivity type to transistors in the corresponding sense amplifiers smaller that that of other transistors of the corresponding conductivity type in the semiconductor memory device, the driving capability of the set drivers can be increased, allowing the sense amplifier size to be minimized as in the second embodiment.

As a result, a semiconductor memory device can be realized which is small in chip size and highly competitive in cost. In addition, the semiconductor memory device provides faster operation because the restoring capability of sense amplifiers is high.

[Fourth Embodiment]

Figure 6:
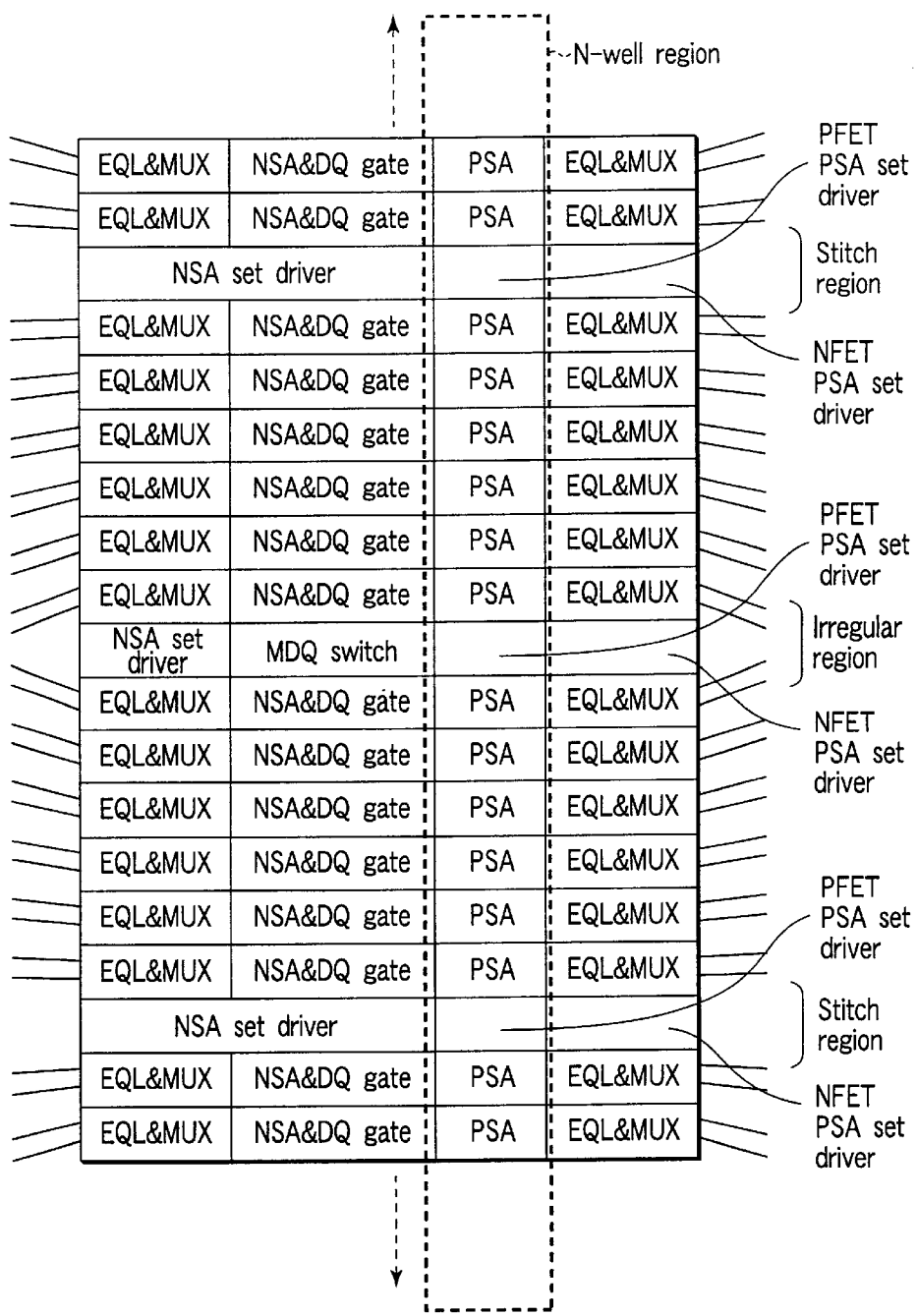
FIG. 6 shows the arrangement of a sense amplifier section according to fourth and ninth embodiments of the present invention.

FIG. 6 shows the arrangement of a fourth embodiment of the present invention.

In the fourth embodiment, set drivers formed by transistors which are of opposite conductivity type to transistors in the corresponding sense amplifiers are placed in either of the previously described word line stitch regions and irregular regions, or in both. An example of a layout of such a sense amplifier section is illustrated in FIG. 6.

The layout of FIG. 6 remains unchanged from the conventional layout in that the EQL&MUX, NSA&DQ gate and PSA are arranged repeatedly as a layout unit, but is characterized in that the repetition period of the layout unit is smaller than that of corresponding bit line pairs.

Such a layout advantageously increases the area of the irregular region in comparison with the case where the repetition period of only the DQ gate and PSA portion is set smaller as in FIG. 3. In addition, that the repetition period varying region is present in the boundary region between the sense amplifier section and the cell array (not shown) not in the layout of the sense amplifier section provides advantage in layout (refer to the ninth embodiment).

The NFET PSA set drivers are placed in the word line stitch regions which have been little used heretofore and the newly developed irregular regions in the P well adjoining the N well and having EQL&MUX placed repeatedly. Transistors of required size can be placed without affecting the other layout portion. Therefore, the size of the sense amplifiers can be shrunk to a minimum. As a result, a semiconductor memory device can be realized which is small in chip size and highly competitive in cost. In addition, the semiconductor memory device provides faster operation because the sense amplifiers has high restoring capability.

[Fifth Embodiment]

Figure 7:
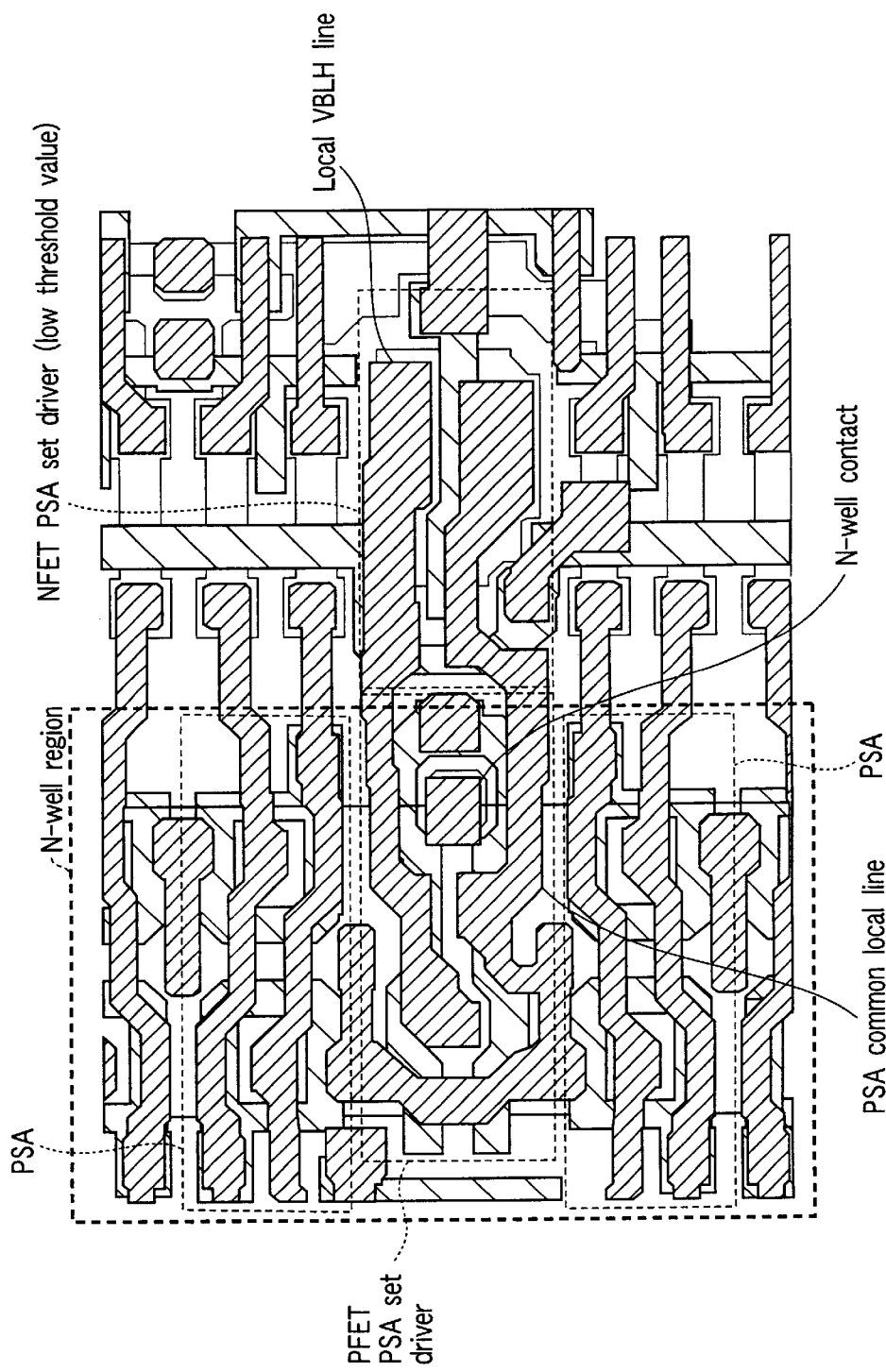
FIG. 7 shows a pattern layout illustrating the arrangement of a PFET and an NFET constituting a PSA set driver according to fifth and eighth embodiments of the present invention.

FIG. 7 shows the arrangement of a fifth embodiment of the present invention.

The fifth embodiment is characterized in that the NFET PSA set driver and the PFET PSA set driver are placed adjacent to each other in a word line stitch region or irregular region.

In FIG. 7, the region on the left which is indicated by bold broken line is a N well region. A PFET PSA set driver, indicated by fine broken line, is placed in the center of the N well region. PSAs indicated by fine broken line are repeatedly placed above and below the PSA set driver. A low-threshold NFET PSA set driver of the previously descried third embodiment, indicated by fine broken line, is placed immediately to the right of the PFET PSA set driver. In FIG. 7, portions indicated by oblique parallel lines with the right down indicate first metal interconnect lines, whereas portions indicated by oblique parallel lines with the left down indicate gate interconnect lines.

The pattern layout of FIG. 7 is an enlarged view of the PFET PSA set driver, the PSAs located above and below the set driver, and the NFET PSA set driver immediately to the right of the PFET PSA set driver in the region where the N well region and the irregular region shown in FIG. 6 intersect.

In FIG. 6, the NFET PSA set driver and the PFET PSA set driver are placed adjacent to each other in each of the stitch region and the irregular region. FIG. 7 shows a specific example of a layout of the NFET PSA set driver and the PFET PSA set driver which are placed adjacent to each other in the irregular region. The circuit construction of NFET and PFET PSA set drivers in FIG. 7 remain unchanged from those in FIG. 4.

The placement of the NFET PSA set driver and the PFET PSA set driver so that they are adjacent to each other as shown in FIG. 7 allows each of the local VBLH line and the PSA local common source line, each of which is formed by a first metal interconnect line, to be shared between them. Therefore, contact with the VBLH power supply line and the PSA common source line (not shown), which are formed above the local interconnect lines by second metal interconnect lines, can be made at any point on the local interconnect lines.

Conventionally, the VBLH power supply line and the PSA common source line have been formed in the neighborhood of the N well region where the PSAs and the PFET PSA set drivers are arranged. Thus, the placement of other circuit than the PFET PSA set driver in the stitch or irregular region in the N well adjacent to the NFET PSA set driver in the stitch or irregular region in the P well would make it difficult to connect the VBLH power supply line and the PSA common source line with the local VBLH line and the local PSA common source line, respectively. For this reason, additional second metal interconnect lines might be required to be formed for the NFET PSA set driver.

Conversely, if each of the local VBLH line and the local PSA common source line can be shared, the second metal interconnect lines, forming the VBLH line and the PSA common source line, need not necessarily be formed in the vicinity of the N well region. That is, they may be formed in the vicinity of the P well region in which the NFET PSA set driver is placed.

Thus, if the NFET PSA set driver and the PFET PSA set driver are placed adjacent to each other in the stitch or irregular region, the freedom in layout of the VBLH power supply line and the PSA common source line is increased, allowing the sense amplifier size to be minimized. As a result, a semiconductor memory device can be realized which is small in chip size and highly competitive in cost.

[Sixth Embodiment]

Figure 8:
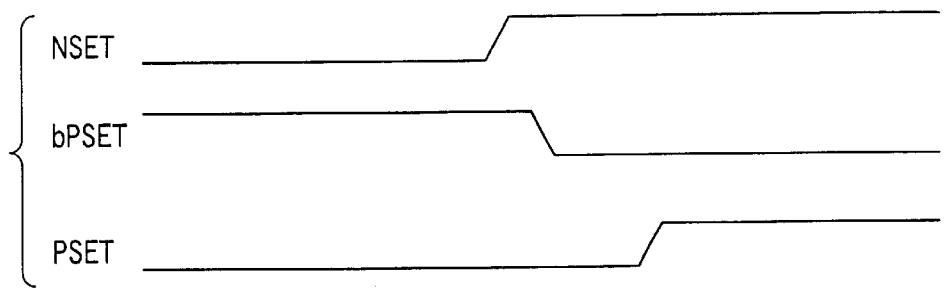
FIG. 8 is a timing diagram of set signals for the PSA set driver according to a sixth embodiment of the present invention.

FIG. 8 is a timing diagram of the set signals in a sixth embodiment of the present invention.

The sixth embodiment is characterized in that a difference is introduced between times at which the set signals bPSET and PSET activate the PFET and NFET PSA set drivers, respectively, in the sense amplifier set driver of FIG. 4. An example of timing of the set signals is illustrated in FIG. 8. As can be seen, a difference in the timing of activation is positively introduced between the set signals bPSET and PSET. The reason is as follows:

In the initial sensing procedure for a small potential difference between bit lines by a sense amplifier, when the transition speed of the common source line is too high, data may be reversed. This is attributed to imbalance in capacitance and/or resistance (including contact resistance) between the paired bit lines BL and /BL seen by the sense amplifier. Such imbalance will cause the potential on one of the bit lines which is effectively smaller in capacitance to change faster when both of the cross-coupled transistors connected to the bit lines BL and /BL are turned on. In that event, the potential difference between the bit lines may be reversed in the middle of the sensing procedure.

Thus, when the transition speed of the common source line is high in the initial sensing procedure, too high a driving capability of the sense amplifier may become a problem. After the initial sensing procedure, however, the restore operation of the sense amplifier will be speeded up as the set driver increases in driving capability.

In the sense amplifier set driver composed of PFET and NFET PSA set drivers, their driving capability can be controlled during the initial sensing interval and enhanced during the subsequent bit-line potential restoring interval by introducing a time difference between their respective set signals. Thus, a sense amplifier can be realized which is high in small potential sensing capability and bit-line potential restoring capability.

In the example of FIG. 8, the set signal bPSET is enabled to activate the corresponding set driver prior to PSET; however, this order may be reversed. Although the sixth embodiment has been described in terms of the set signals for the PSA set drivers, this is not restrictive.

That is, a time difference may also be introduced between two set signals bNSET and NSET for activating PFET and NFET NSA set drivers, respectively. By so doing, an NSA can be realized which is high in small potential sensing capability and bit-line potential restoring capability.

In the case as well in which the NSA set driver is composed of two PFETs and the PSA set driver is composed of two NFETs, a difference in the timing of activation may be introduced between two set signals for activating the two NFETs or PFETs. By so doing, an NSA or PSA can also be realized which is high in small potential sensing capability and bit-line potential restoring capability. The NSA set driver may further be composed of two sorts of NFETs and PSA set driver, composed of two sorts of PFETs. The difference in activation timing may be between two set signals for activating the two sorts of NFETs or PFETs.

[Seventh embodiment]

A seventh embodiment of the present invention will be described next with reference to FIGS. 9 and 10.

The seventh embodiment is described in terms of application of the aforementioned PSA (or NSA) set driver comprising an NFET and a PFET to a common source line overdrive scheme for increasing the operating speed of a semiconductor memory device.

Figure 9:
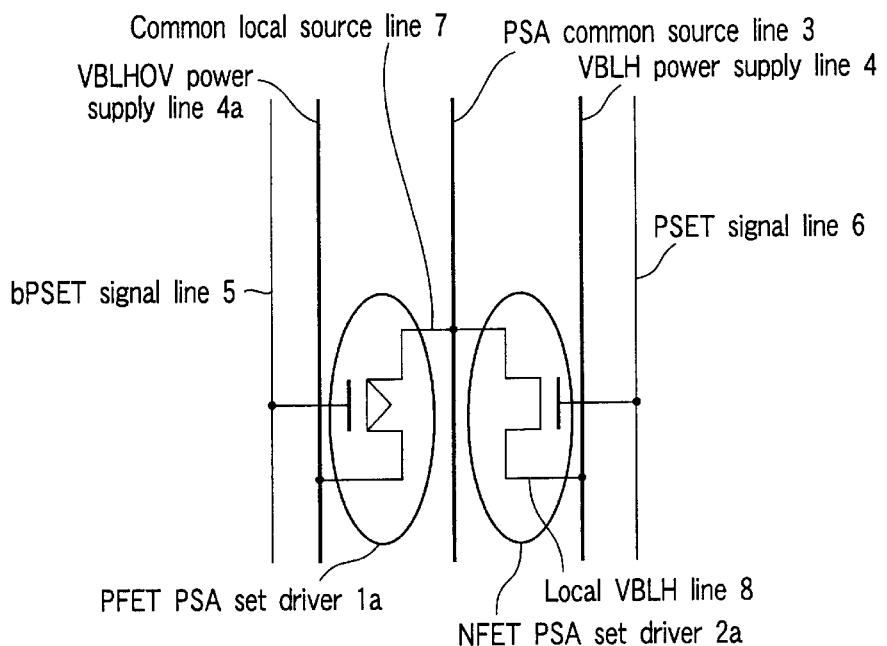
FIG. 9 shows the circuit arrangement of a bit line overdrive PSA set driver according to a seventh embodiment of the present invention.

As shown in FIG. 9, a VBLHOV power supply line 4a is connected to the PFET PSA set driver 1a to provide an overdrive voltage VBLHOV higher than the final restore voltage VBLH to the PSA common source line 3a at an early stage in the sensing procedure. A VBLH power supply line 4 is connected to the NFET PSA set driver 2a to provide the final restore voltage VBLH to the PSA common source line 3. The other circuit arrangement remains unchanged from that of FIG. 4 and corresponding parts to those in FIG. 4 are denoted by like reference numerals.

Figure 10:
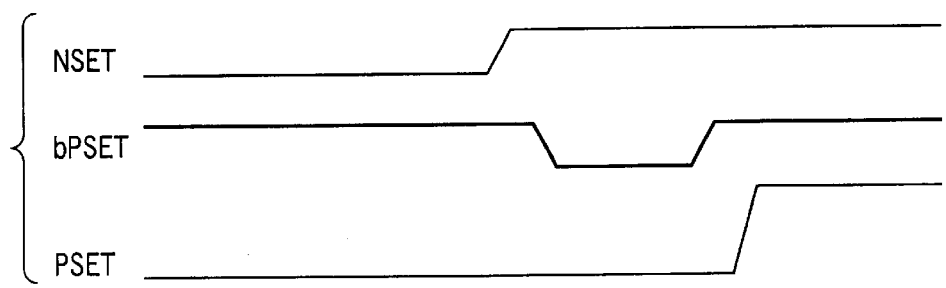
FIG. 10 is a timing diagram of set signals for the bit line overdrive PSA set driver according to the seventh embodiment of the present invention.

Using FIG. 10 which shows the timing diagram of the set signals, a description is given of the operation of the PSA set driver with the bit line overdrive function shown in FIG. 9. At an early stage in the sensing procedure, the set signal bPSET for the PFET PSA set driver 1a connected with the VBLHOV power supply line 4a is first activated to raise rapidly the potential on the PSA common source line 3 toward the final restore voltage VBLH.

After that, the set signal bPSET is restored to the normal level. Subsequently, the set signal PSET for the NFET PSA set driver 2a is activated with the result that the final potential on the PSA common source line 3 reaches the restore voltage VBLH. As described previously in connection with the second embodiment, in the seventh embodiment shown in FIG. 10 as well, the method is adopted to enhance the driving capability of the NFET PSA set driver 2a by setting the potential of the activated set signal PSET higher than the internal supply voltage VINT in the semiconductor memory device.

In the example of FIG. 9, the PFET PSA set driver is connected to the overdrive voltage VBLHOV; instead, the NFET PSA set driver may be connected to VBLHOV. Although the seventh embodiment has been described as overdriving the PSA common source line, in overdriving the NSA common source line, use is made of the overdrive voltage VBLLOV lower than the final restore voltage VBLL. Similar overdriving may also be applied for the case when the NSA set driver is formed of two sorts of PFETs and the PSA set driver, formed of two sorts of NFETs. Furthermore, similar overdriving may be applied for the case when the NSA set driver is formed of two sorts of NFETs and the PSA set driver, formed of two sorts of PFETs.

[Eighth Embodiment]

An eighth embodiment will be described next using FIG. 6 again.

The eighth embodiment is characterized in that no contact for biasing the well in which sense amplifier constituent elements are placed is formed within the repetition unit of the sense amplifier layout. In the example of FIG. 7, an N well contact is placed in the PFET PSA set driver formed region in the irregular region resulting from the difference in repetition period between PSAs and bit lines, not in the PSA formed region.

By so doing, the width of the N well region comes to be determined by the size of the PSA layout itself. The placement of the well contact in the N well in the irregular region reduces the layout region for the PFET PSA set driver by the amount corresponding to that contact. This may make it difficult to place the PFET PSA set driver of the required size. In such case, to reduce the size of the PFET PSA set driver, an NFET PSA set driver is simply used at the same time as described previously in connection with the first embodiment. It is also possible only to use NFETs for constituting PSA set driver.

According to the eighth embodiment, the sense amplifier size can be minimized. As a result, a semiconductor memory device can be realized which is small in chip size and highly competitive in cost.

[Ninth Embodiment]

A ninth embodiment will be described next using FIG. 6 again.

The ninth embodiment is characterized in that, when the repetition period of the sense amplifier layout and the repetition period of the bit line layout differ, the period varying region is present in the boundary region between the sense amplifier section and the cell array as shown in FIG. 6.

Usually, in the boundary region between the sense amplifier section and the cell array is formed a contact that provides the substrate potential to the well in which sense amplifier circuit elements are formed. In addition, when the well in which cell transistors are laid out is biased by a different potential, another contact is placed to provide the bias potential. Other circuit elements than these contacts will never be placed in the boundary region between the sense amplifier section and the cell array.

Those well contacts of a predetermined number are not required for each sense amplifier unlike the circuit elements constituting the sense amplifiers. Thus, the contacts need not be arranged at regular intervals. When the cell array well potential is different from the sense amplifier well potential, the cell array must be a dual well structure in order to isolate the cell array well and the sense amplifier well from each other. This increases the distance between cell transistors making up the cell array and the transistors constituting the sense amplifiers, allowing the boundary region to have higher freedom in layout.

In the layout in which the sense amplifier repetition period and the bit line repetition period differ from each other, the slope of lines for connection between bit lines and sense amplifiers increases in the boundary region in the vicinity of the irregular region, making the connection difficult. For ease of connection, in some cases, the sense amplifier size has to be increased.

In the ninth embodiment, the pitch varying irregular region is present not in the layout of the sense amplifier section as shown in FIG. 3 but in the boundary between the sense amplifier section and the cell array (not shown). In the boundary region, only the well contacts are present which can be arranged irregularly. It is therefore possible to thin out the contacts in the region where connection is difficult. Since the sense amplifier transistors and the cell transistors are located at a distance apart from each other, the slope of the connection lines can be made gentle.

Thus, since the pitch varied boundary region is present between the sense amplifier section and the cell array, an increase in the required area of the boundary region can be checked to a minimum. As a result, a semiconductor memory device can be realized which is small in chip size and highly competitive in cost.

[Tenth Embodiment]

A tenth embodiment of the present invention will be described next with reference to FIG. 11.

In the tenth embodiment, the two sense amplifier transistors constituting the differential amplifier circuit (Q16 and Q17 in FIG. 1), cross-coupled between paired bit lines, form a pattern such that, when it were moved in parallel, one of the two transistors could be superimposed upon the other with respect to diffusion areas, gate wirings and contacts from first metal lines to the diffusion areas. The two DQ gate transistors (Q18 and Q19 in FIG. 1) connected to the same paired bit lines also form the above described superimposable pattern with parallel movement. The diffusion area on the BL side of the sense amplifier and the diffusion area on the BL side of the DQ gate consist of a common diffusion area. Likewise, the diffusion area on the /BL side of the sense amplifier and the diffusion area on the /BL side of the DQ gate consist of a common diffusion area.

Figure 11:
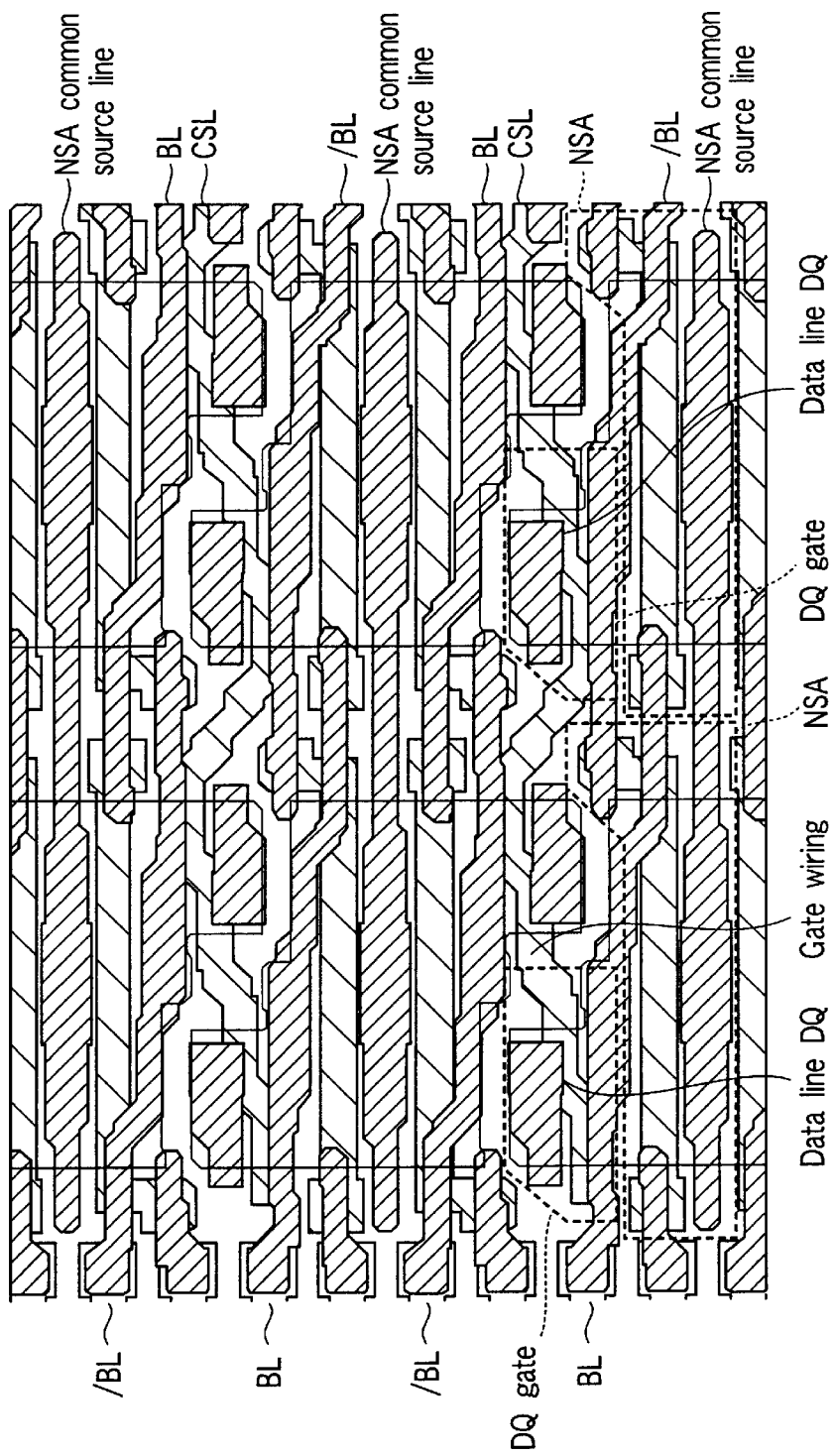
FIG. 11 shows repeating pattern layouts of sense amplifier transistors and DQ gate transistors according to a tenth embodiment of the present invention.

In FIG. 11, the paired bit lines BL and /BL, the NSA common source lines and the data lines, which are all first metal interconnect lines, are represented by lower-right-pointing oblique parallel lines. The gate conductors and the column select lines CSL (see FIG. 1) are represented by upper-right-pointing oblique parallel lines. The two sense amplifier transistors, arranged adjacent to each other in the above described superimposable pattern layout, are each indicated by broken line. The two DQ gate transistors, which are also arranged in the superimposable pattern layout above the sense amplifier transistors, are each indicated by broken line.

Another pair of sense amplifier transistors and another pair of DQ gate transistors are arranged above the arrangement of the aforesaid first pairs of sense amplifier transistors and DQ gate transistors. The pattern layout of the pair of DQ gate transistors connected to one bit line pair and the pattern layout of another pair of DQ gate transistors connected to the adjacent bit line pair are symmetrical with respect to a point in the pattern layout of the sense amplifier. The diffusion areas, each of which is shared between corresponding sense amplifier and DQ gate transistors are formed in portions of the semiconductor substrate which are just below the paired bit lines BL and /BL.

In FIG. 6, the NSA and the DQ gate are shown as one block; however, they are actually laid out as shown in FIG. 11. In the layout of FIG. 11, two transistors constituting an NSA are each formed into a perfectly superimposable pattern with parallel movement. That is, with respect to patterns of active regions (diffusion areas), gate conductors, and contacts to the active regions, one of the two transistors could be completely superimposed upon the other if it were moved in parallel.

Likewise, the two DQ gate transistors are each formed in a perfectly superimposable pattern with parallel movement. Such a superimposable pattern has become feasible by connecting the pair of bit lines BL, /BL comprising the first metal to the gate wirings of the sense amplifier transistors on the semiconductor substrate so as to twist each other.

Individual transistors show some variations in their characteristics due to misalignment of masks used in process steps. However, the arrangement of paired transistors in a superimposable pattern with parallel movement allows variations in their characteristics to be controlled. Thus, by arranging each pair of transistors in the NSA and DQ gate in a superimposable pattern, the difference in characteristic values between the paired transistors due to mask misalignment can be controlled, allowing a sense amplifier which is high in amplifying capability for a small signal to be implemented.

The sense amplifier layout is required to be small in its size in the direction in which the bit lines extend in the narrow region defined by the period of arrangement of the bit lines. By allowing the sense amplifier transistors and the DQ gate transistors to share diffusion areas on the bit line side, the sense amplifier transistors and the DQ gate transistors can be arranged repeatedly in the same layout, allowing the size in the bit line direction to be minimized.

This advantage also results from connecting the paired bit lines BL and /BL with the gate interconnections of the sense transistors in a twisted manner in the sense amplifier layout to thereby reduce the density of the first metal interconnect lines.

By sharing the diffusion areas, the parasitic capacitance associated with the bit lines can be reduced in comparison with the case where separate diffusion areas are provided, which also helps enhance the amplifying capability.

Therefore, the tenth embodiment can provide a sense amplifier for use in a semiconductor memory device which is great in the margin of mask misalignment, high in the small-signal amplifying capability, and small in the layout size. In addition, since the common sources of two transistors constituting the NSA are directly connected together by a first metal interconnect line as shown in FIG. 11, the potential difference between the common sources of the transistors can be reduced to a minimum at sense time. Thus, the small-signal amplifying capability can be enhanced further. The present invention may be practiced or embodied in still other ways without departing from the scope and spirit thereof.

According to the present invention, as described above, the layout size of the entire sense amplifier section including control circuits can be reduced by forming the set driver for a sense amplifier from both an NFET and a PFET or by forming the PSA set driver from an NFET and the NSA set driver from a PFET. A semiconductor memory device can be implemented which is small in chip size, high in small-signal amplifying capability, and highly competitive in cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A sense amplifier section of a semiconductor memory device including a memory cell array and a plurality of bit line pairs arranged in a column direction of the memory cell array, the sense amplifier section being configured to control the transfer of data to or from the memory cell array via the bit line pairs, the sense amplifier section comprising:

an array of layout units respectively including circuit portions of sense amplifiers formed in a well region, wherein none of the layout units include any contacts for biasing the well region; and a contact disposed outside of the layout units and configured to bias the well region.

2. The sense amplifier section according to claim 1, wherein the layout units are disposed in the array of layout units at intervals smaller than intervals of the bit line pairs.

3. The sense amplifier section according to claim 1, further comprising an additional region disposed among the layout units, and the contact is disposed in the additional region.

4. The sense amplifier section according to claim 3, wherein the layout units are disposed at regular intervals except in the additional region.

5. The sense amplifier section according to claim 3, wherein the additional region is produced among the layout units due to intervals of the layout units being smaller than intervals of the bit line pairs.

6. The sense amplifier section according to claim 2, further comprising a varying region in which the intervals of the layout units are obtained by changing the intervals of the bit line pairs in a portion in contact with a boundary between the sense amplifier section and the memory cell array.

7. A sense amplifier section of a semiconductor memory device including a memory cell array and a plurality of bit line pairs arranged in a column direction of the memory cell array, the sense amplifier section being configured to control the transfer of data to or from the memory cell array via the bit line pairs, the sense amplifier section comprising:

an array of layout units directly connected to the bit line pairs and respectively including circuit portions of sense amplifiers, wherein the layout units are disposed in the array of layout units at intervals smaller than intervals of the bit line pairs.

8. The sense amplifier section according to claim 7, wherein the sense amplifier section consists essentially of a plurality of arrays of layout units, in which the array of layout units respectively includes circuit portions of sense amplifiers, and intervals of the layout units are the same among the plurality of arrays of layout units.

9. The sense amplifier section according to claim 7, further comprising an additional region produced among the layout units due to the intervals of the layout units being smaller than the intervals of the bit line pairs, and the layout units being disposed at regular intervals except in the additional region.

10. The sense amplifier section according to claim 8, wherein, in each of the plurality of arrays of layout units, an additional region is produced among the layout units due to the intervals of the layout units being smaller than the intervals of the bit line pairs, and the layout units are disposed at regular intervals except in the additional region.

11. The sense amplifier section according to claim 7, further comprising a varying region, in which the intervals of the layout units are obtained by changing the intervals of the bit line pairs in a portion in contact with a boundary between the sense amplifier section and the memory cell array.

12. A sense amplifier section of a semiconductor memory device including a memory cell array and a plurality of bit line pairs arranged in a column direction of the memory cell array, the sense amplifier section being configured to control the transfer of data to or from the memory cell array via the bit line pairs, the sense amplifier section comprising:

an array of sense amplifiers disposed at intervals smaller than intervals of the bit line pairs; and a varying region, in which the intervals of the sense amplifiers are obtained by changing the intervals of the bit line pairs formed in a portion in contact with a boundary between the sense amplifier section and the memory cell array.

13. The sense amplifier section according to claim 12, further comprising an additional region produced among the sense amplifiers due to the intervals of the sense amplifiers being smaller than the intervals of bit line pairs, and the sense amplifiers are disposed at regular intervals except in the additional region.

14. The sense amplifier section according to claim 12, wherein the sense amplifier section consists essentially of a plurality of arrays of layout units in which an array of layout units respectively includes circuit portions of the sense amplifiers, and intervals of the layout units are the same among the plurality of arrays of layout units.

* * * * *